US010635535B2

(12) United States Patent
Cha et al.

(10) Patent No.: US 10,635,535 B2
(45) Date of Patent: Apr. 28, 2020

(54) SEMICONDUCTOR MEMORY DEVICES, MEMORY SYSTEMS, AND METHODS OF OPERATING THE SEMICONDUCTOR MEMORY DEVICES

(71) Applicant: SAMSUNG ELECTRONICS CO., LTD., Suwon-si, Gyeonggi-Do (KR)

(72) Inventors: Sang-Uhn Cha, Suwon-si (KR); Kyung-Ryun Kim, Seoul (KR); Young-Hun Seo, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/185,453

(22) Filed: Nov. 9, 2018

(65) Prior Publication Data
US 2019/0243708 A1  Aug. 8, 2019

(30) Foreign Application Priority Data

Feb. 5, 2018  (KR) ........................ 10-2018-0013723

(51) Int. Cl.
| G06F 11/00 | (2006.01) |
| G11C 29/52 | (2006.01) |
| G11C 29/04 | (2006.01) |
| G11C 29/42 | (2006.01) |
| G06F 11/10 | (2006.01) |
| H01L 25/065 | (2006.01) |
| G11C 11/4093 | (2006.01) |
| G11C 11/4096 | (2006.01) |
| G11C 11/407 | (2006.01) |
| G11C 5/04 | (2006.01) |

(52) U.S. Cl.
CPC ...... *G06F 11/1068* (2013.01); *G06F 11/1048* (2013.01); *G11C 11/4093* (2013.01); *G11C 11/4096* (2013.01); *G11C 29/52* (2013.01); *H01L 25/0657* (2013.01); *G11C 5/04* (2013.01); *G11C 11/407* (2013.01); *H01L 2225/06513* (2013.01); *H01L 2225/06541* (2013.01)

(58) Field of Classification Search
None
See application file for complete search history.

(56) References Cited

U.S. PATENT DOCUMENTS

| 8,848,465 B2 | 9/2014 | Kim et al. |
| 8,898,544 B2 | 11/2014 | Franceschini et al. |
| 8,996,960 B1 | 3/2015 | Saxena et al. |

(Continued)

*Primary Examiner* — Phung M Chung
(74) *Attorney, Agent, or Firm* — F. Chau & Associates, LLC

(57) ABSTRACT

A semiconductor memory device includes a memory cell array, an error correction code (ECC) engine, an input/output (I/O) gating circuit, and a control logic circuit. The memory cell array includes a plurality of bank arrays, and each of the bank arrays includes dynamic memory cells. The control logic circuit generates a first control signal to control the I/O gating circuit and a second control signal to control the ECC engine, in response to an access address and a command. The control logic circuit controls the ECC engine to perform s-bit ECC encoding on a write data to be stored in a first page of at least one bank array, in response to a first command, and controls the ECC engine to perform t-bit ECC decoding on a first codeword read from the first page, in response to a second command.

20 Claims, 17 Drawing Sheets

(56) References Cited

U.S. PATENT DOCUMENTS

| | | |
|---|---|---|
| 9,136,872 B2 | 9/2015 | Oh et al. |
| 9,311,180 B2 | 4/2016 | Takahashi |
| 9,588,840 B2 | 3/2017 | Chung et al. |
| 9,632,856 B2 | 4/2017 | Chung et al. |
| 9,646,718 B2 * | 5/2017 | Park .................. G11C 29/42 |
| 9,805,827 B2 * | 10/2017 | Son .................. G11C 29/4401 |
| 9,859,022 B2 * | 1/2018 | Kim .................. G11C 29/52 |
| 2016/0147599 A1 | 5/2016 | Kim |
| 2017/0109231 A1 | 4/2017 | Cha et al. |
| 2017/0235634 A1 | 8/2017 | Kim |

\* cited by examiner

SEMICONDUCTOR MEMORY DEVICES, MEMORY SYSTEMS, AND METHODS OF OPERATING THE SEMICONDUCTOR MEMORY DEVICES

CROSS-REFERENCE TO RELATED APPLICATION

This application claims priority under 35 U.S.C. § 119 to Korean Patent Application No. 10-2018-0013723, filed on Feb. 5, 2018 in the Korean Intellectual Property Office, the disclosure of which is incorporated by reference herein in its entirety.

TECHNICAL FIELD

Exemplary embodiments of the inventive concept relate to memories, and more particularly, to semiconductor memory devices, memory systems, and methods of operating semiconductor memory devices.

DISCUSSION OF RELATED ART

Semiconductor memory devices may be classified into non-volatile memory devices, such as flash memory devices, and volatile memory devices, such as dynamic random-access memory DRAMs. High speed operation and cost efficiency of DRAMs make it possible for DRAMs to be used for system memories. Due to continuing shrinkage in fabrication design rules of DRAMs, bit errors of memory cells in the DRAMs may rapidly increase and yield of the DRAMs may decrease.

SUMMARY

According to an exemplary embodiment of the inventive concept, a semiconductor memory device includes a memory cell array, an error correction code (ECC) engine, an input/output (I/O) gating circuit, and a control logic circuit. The memory cell array includes a plurality of bank arrays, and each of the plurality of bank arrays includes dynamic memory cells. The I/O gating circuit is connected between the ECC engine and the memory cell array. The control logic circuit generates a first control signal to control the I/O gating circuit and a second control signal to control the ECC engine, in response to an access address and a command received from an outside. The control logic circuit controls the ECC engine to perform s-bit ECC encoding on a write data to be stored in a first page of at least one bank array selected from the plurality of bank arrays, in response to a first command, and controls the ECC engine to perform t-bit ECC decoding on a first codeword read from the first page, in response to a second command. Here, s is a natural number greater than one and t is a natural number smaller than s.

According to an exemplary embodiment of the inventive concept, a memory system includes at least one semiconductor memory device and a memory controller. The memory controller controls the at least one semiconductor memory device. The at least one semiconductor memory device includes a memory cell array, an error correction code (ECC) engine, an input/output (I/O) gating circuit and a control logic circuit. The memory cell array includes a plurality of dynamic memory cells. The I/O gating circuit is connected between the ECC engine and the memory cell array. The control logic circuit controls the I/O gating circuit and the ECC engine, in response to an access address and a command received from the memory controller. The control logic circuit controls the ECC engine to perform s-bit ECC encoding on a write data to be stored in a first page of at least one bank array selected from the memory cell array, in response to a first command from the memory controller, and controls the ECC engine to perform t-bit ECC decoding on a first codeword read from the first page, in response to a second command from the memory controller. Here, s is a natural number greater than one and t is a natural number smaller than s.

According to an exemplary embodiment of the inventive concept, in a method of operating a semiconductor memory device including a memory cell array that includes a plurality of dynamic memory cells, s-bit ECC encoding is performed on a main data to be stored in a first page in the memory cell array to store a first codeword in the first page, in response to an access address and a first command received from an outside, t-bit ECC decoding is performed on the first codeword read from the first page in response to a second command received from the outside, s-bit ECC decoding is performed on a second codeword read from a second page of the memory cell array, in response to a third command received from the outside, and the second codeword corrected by the s-bit ECC decoding is written back in a sub-page of the second page. Here, s is a natural number greater than one and t is a natural number smaller than s.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EMBODIMENTS

Figure 1:
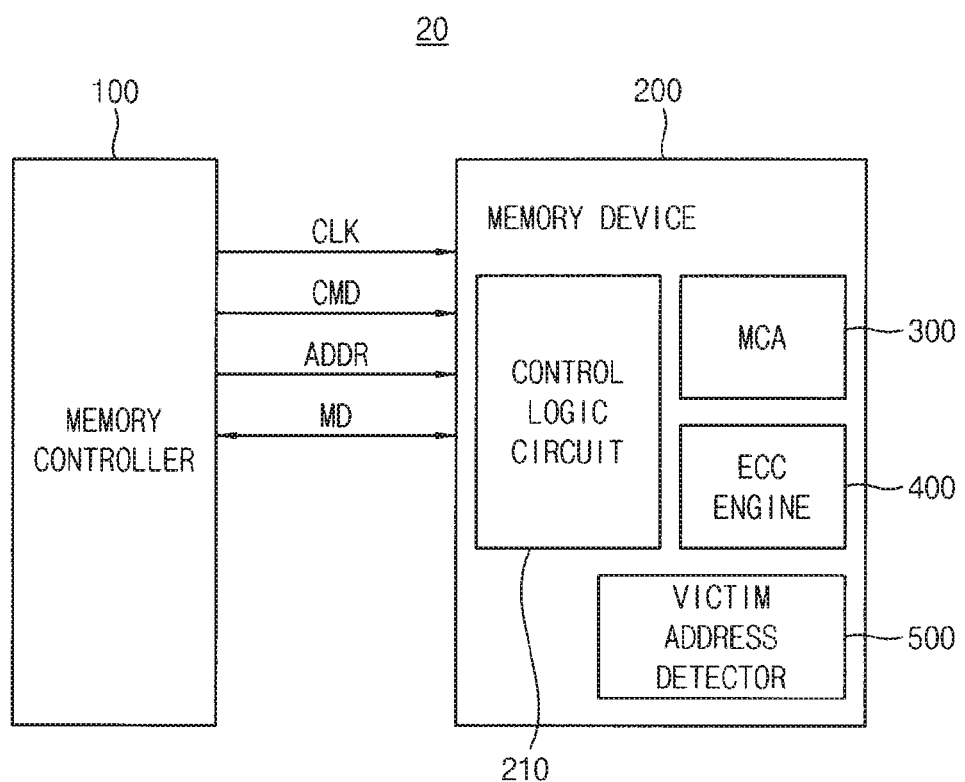
FIG. 1 is a block diagram illustrating a memory system according to an exemplary embodiment of the inventive concept.

Exemplary embodiments of the inventive concept will be described more fully hereinafter with reference to the accompanying drawings. Like reference numerals may refer to like elements throughout this application.

FIG. 1 is a block diagram illustrating a memory system according to an exemplary embodiment of the inventive concept.

Referring to FIG. 1, a memory system 20 may include a memory controller 100 and at least one semiconductor memory device 200.

The memory controller 100 may control overall operation of the memory system 20. The memory controller 100 may control overall data exchange between an external host and the semiconductor memory device 200. For example, the memory controller 100 may write data in the semiconductor memory device 200 or read data from the semiconductor memory device 200 in response to a request from the host.

In addition, the memory controller 100 may issue operation commands to the semiconductor memory device 200 for controlling the semiconductor memory device 200.

In exemplary embodiments of the inventive concept, the semiconductor memory device 200 is a memory device including dynamic memory cells such as a dynamic random access memory (DRAM), double data rate 4 (DDR4) synchronous DRAM (SDRAM), a low power DDR4 (LPDDR4) SDRAM, or a LPDDR5 SDRAM.

The memory controller 100 transmits a clock signal CLK, a command CMD, and an address (signal) ADDR to the semiconductor memory device 200 and exchanges main data MD with the semiconductor memory device 200.

The semiconductor memory device 200 includes a memory cell array 300 that stores the main data MD and parity bits, an error correction code (ECC) engine 400, a control logic circuit 210, and a victim address detector 500.

The ECC engine 400 may perform s-bit ECC encoding on a write data to be stored in a target page of the memory cell array 300, and may perform t-bit ECC decoding or a s-bit ECC decoding on a codeword read from the target page under control of the control logic circuit 210. Here, "s" is a natural number greater than one and "t" is a natural number smaller than "s."

The victim address detector 500 may count a number of accesses to a first memory region in the memory cell array 300 and may generate at least one victim address designating at least one adjacent memory region adjacent to the first memory region when the number of the counted accesses reaches a reference value during a reference interval.

Figure 2:
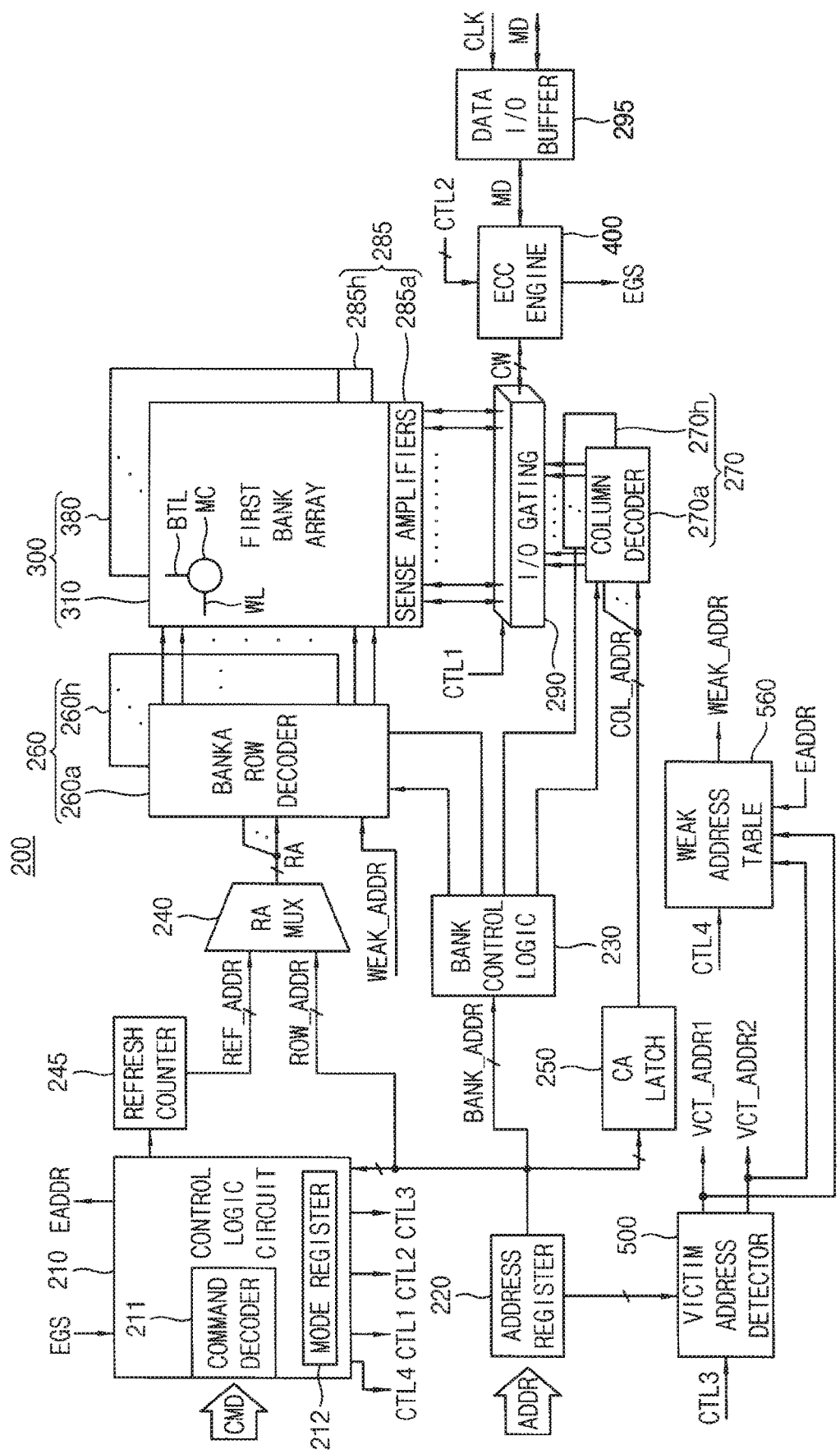
FIG. 2 is a block diagram illustrating the semiconductor memory device in FIG. 1 according to an exemplary embodiment of the inventive concept.

FIG. 2 is a block diagram illustrating the semiconductor memory device in FIG. 1 according to an exemplary embodiment of the inventive concept.

Referring to FIG. 2, the semiconductor memory device 200 includes the control logic circuit 210, an address register 220, a bank control logic 230, a refresh counter 245, a row address multiplexer 240, a column address latch 250, a row decoder 260, a column decoder 270, the memory cell array 300, a sense amplifier unit 285, an I/O gating circuit 290, the ECC engine 400, a victim address detector 500, a weak address table 560, and a data I/O buffer 295.

The memory cell array 300 includes first through eighth bank arrays 310~380. The row decoder 260 includes first through eighth bank row decoders 260a~260h respectively coupled to the first through eighth bank arrays 310~380, the column decoder 270 includes first through eighth bank column decoders 270a~270h respectively coupled to the first through eighth bank arrays 310~380, and the sense amplifier unit 285 includes first through eighth bank sense amplifiers 285a~285h respectively coupled to the first through eighth bank arrays 310~380. Each of the first through eighth bank arrays 310~380 includes a plurality of memory cells MC formed at intersections of a plurality of word-lines WL and a plurality of bit-lines BTL.

The first through eighth bank arrays 310~380, the first through eighth bank row decoders 260a~260h, the first through eighth bank column decoders 270a~270h, and the first through eighth bank sense amplifiers 285a~285h may form first through eighth banks. The address register 220 receives the address ADDR including a bank address BANK_ADDR, a row address ROW_ADDR, and a column address COL_ADDR from the memory controller 100. The address register 220 provides the received bank address BANK_ADDR to the bank control logic 230, provides the received row address ROW_ADDR to the row address multiplexer 240, and provides the received column address COL_ADDR to the column address latch 250.

The bank control logic 230 generates bank control signals in response to the bank address BANK_ADDR. One of the first through eighth bank row decoders 260a~260h corresponding to the bank address BANK_ADDR is activated in response to the bank control signals, and one of the first through eighth bank column decoders 270a~270h corresponding to the bank address BANK_ADDR is activated in response to the bank control signals.

The row address multiplexer 240 receives the row address ROW_ADDR from the address register 220, and receives a refresh row address REF_ADDR from the refresh counter 245. The row address multiplexer 240 selectively outputs the row address ROW_ADDR or the refresh row address REF_ADDR as a row address RA. The row address RA that is output from the row address multiplexer 240 is applied to the first through eighth bank row decoders 260a~260h.

The activated one of the first through eighth bank row decoders 260a~260h, by the bank control logic 230, decodes the row address RA that is output from the row address multiplexer 240, and activates a word-line corresponding to the row address RA. For example, the activated bank row decoder applies a word-line driving voltage to the word-line corresponding to the row address RA.

The column address latch 250 receives the column address COL_ADDR from the address register 220, and temporarily stores the received column address COL_ADDR. In exemplary embodiments of the inventive concept, in a burst mode, the column address latch 250 generates column addresses that increment from the received column address COL_ADDR. The column address latch 250 applies the temporarily stored or generated column address to the first through eighth bank column decoders 270a~270h.

The activated one of the first through eighth bank column decoders 270a~270h activates a sense amplifier, among the first through eighth bank sense amplifiers 285a~285h, corresponding to the bank address BANK_ADDR and the column address COL_ADDR, through the I/O gating circuit 290.

The I/O gating circuit 290 includes a circuitry for gating input/output data, and further includes input data mask logic, read data latches for storing data that is output from the first through eighth bank arrays 310~380, and write drivers for writing data to the first through eighth bank arrays 310~380.

Codeword CW read from one bank array of the first through eighth bank arrays 310~380 is sensed by a sense amplifier coupled to the one bank array from which the data is to be read, and is stored in the read data latches. The codeword CW stored in the read data latches may be provided to the memory controller 100 via the data I/O buffer 295 after ECC decoding is performed on the codeword CW by the ECC engine 400.

The main data MD to be written in one bank array of the first through eighth bank arrays 310~380 may be provided to the data I/O buffer 295 from the memory controller 100, and may be provided to the ECC engine 400 from the data I/O buffer 295. The ECC engine 400 may perform an ECC encoding on the main data MD to generate parity bits, the ECC engine 400 may provide the main data MD and the parity bits to the I/O gating circuit 290, and the I/O gating circuit 290 may write the main data MD and the parity bits in the target page in one bank array, through the write drivers.

The data I/O buffer 295 may provide the main data MD from the memory controller 100 to the ECC engine 400 in a write operation of the semiconductor memory device 200, based on the clock signal CLK, and may provide the main data MD from the ECC engine 400 to the memory controller 100 in a read operation of the semiconductor memory device 200.

The ECC engine 400 performs perform t-bit ECC decoding or s-bit ECC decoding on a codeword (e.g., CW) read from a sub-page of the target page and may provide an error generation signal EGS to the control logic circuit 210 to correct at least one error bit when the at least one error bit is detected in the main data MD in the codeword. The control logic circuit 210 may store a row address and a column address of the codeword including the at least one error bit, in the weak address table 560 as an error address EADDR.

It is assumed that the ECC engine 400 is implemented with a double error correction (DEC) that is capable of correcting two error bits in the main data MD.

In an exemplary embodiment of the inventive concept, the ECC engine 400, instead of the control logic circuit 210, may directly store the error address EADDR in the weak address table 560.

The control logic circuit 210 may control operations of the semiconductor memory device 200. For example, the control logic circuit 210 may generate control signals for the semiconductor memory device 200 to perform a write operation or a read operation. The control logic circuit 210 includes a command decoder 211 that decodes the command CMD received from the memory controller 100 and a mode register 212 that sets an operation mode of the semiconductor memory device 200.

For example, the command decoder 211 may generate the control signals corresponding to the command CMD by decoding a write enable signal, a row address strobe signal, a column address strobe signal, a chip select signal, etc. The control logic circuit 210 may generate a first control signal CTL1 to control the I/O gating circuit 290, a second control signal CTL2 to control the ECC engine 400, a third control signal CTL3 to control the victim address detector 500, and a fourth control signal CTL4 to control the weak address table 560.

When the command CMD corresponds to a write command (e.g., a first command) designating a write operation, the control logic circuit 210 may control the ECC engine 400 to perform the s-bit ECC encoding on the main data MD. When the command CMD corresponds to a read command (e.g., a second command) designating a read operation, the control logic circuit 210 may control the ECC engine 400 to perform the t-bit ECC decoding on the codeword CW read from a sub-page of the target page.

When the command CMD corresponds to a refresh command (e.g., a third command) designating a refresh operation, the control logic circuit 210 may control the ECC engine 400 to perform the s-bit ECC decoding on the codeword CW read from the sub-page of the target page. When the ECC engine 400 performs the s-bit ECC decoding, the control logic circuit 210 controls the ECC engine 400 to perform a scrubbing operation to write back a corrected main data in the sub-page.

The victim address detector 500 may count a number of accesses to a first memory region in the memory cell array 300 to generate at least one victim address VCT_ADDR1 and VCT_ADDR2 designating at least one adjacent memory region adjacent to the first memory region when the number of the counted accesses reaches the reference value during the reference interval.

The weak address table 560 may store the at least one victim address VCT_ADDR1 and VCT_ADDR2. The weak address table 560 may further store an address of a codeword including at least one error bit, which is detected by the t-bit ECC decoding, or an address of a page including the codeword, as the error address EADDR. The weak address table 560 may store an address of a page including error bits, which are detected by the s-bit ECC decoding and whose number is greater than or equal to a threshold value, as the error address EADDR.

The control logic circuit 210 may control the ECC engine 400 to perform the s-bit ECC decoding on weak pages corresponding to weak addresses WEAK_ADDR stored in the weak address table 560, in response to the third command. The control logic circuit 210 may count a number of applications of the third command, and may provide the fourth control signal CTL4 to the weak address table 560 based on the counted number such that the weak addresses WEAK_ADDR are provided to the row decoder 260.

Therefore, the address ADDR (also referred to as an access address ADDR) may designate a codeword (e.g., a first codeword) on which the s-bit ECC encoding is to be performed in response to the first command. In addition, a codeword (e.g., a second codeword) on which the t-bit ECC decoding or the s-bit ECC decoding is to be performed may be designated by an internal address, which is generated inside the semiconductor memory device 200.

Figure 3:
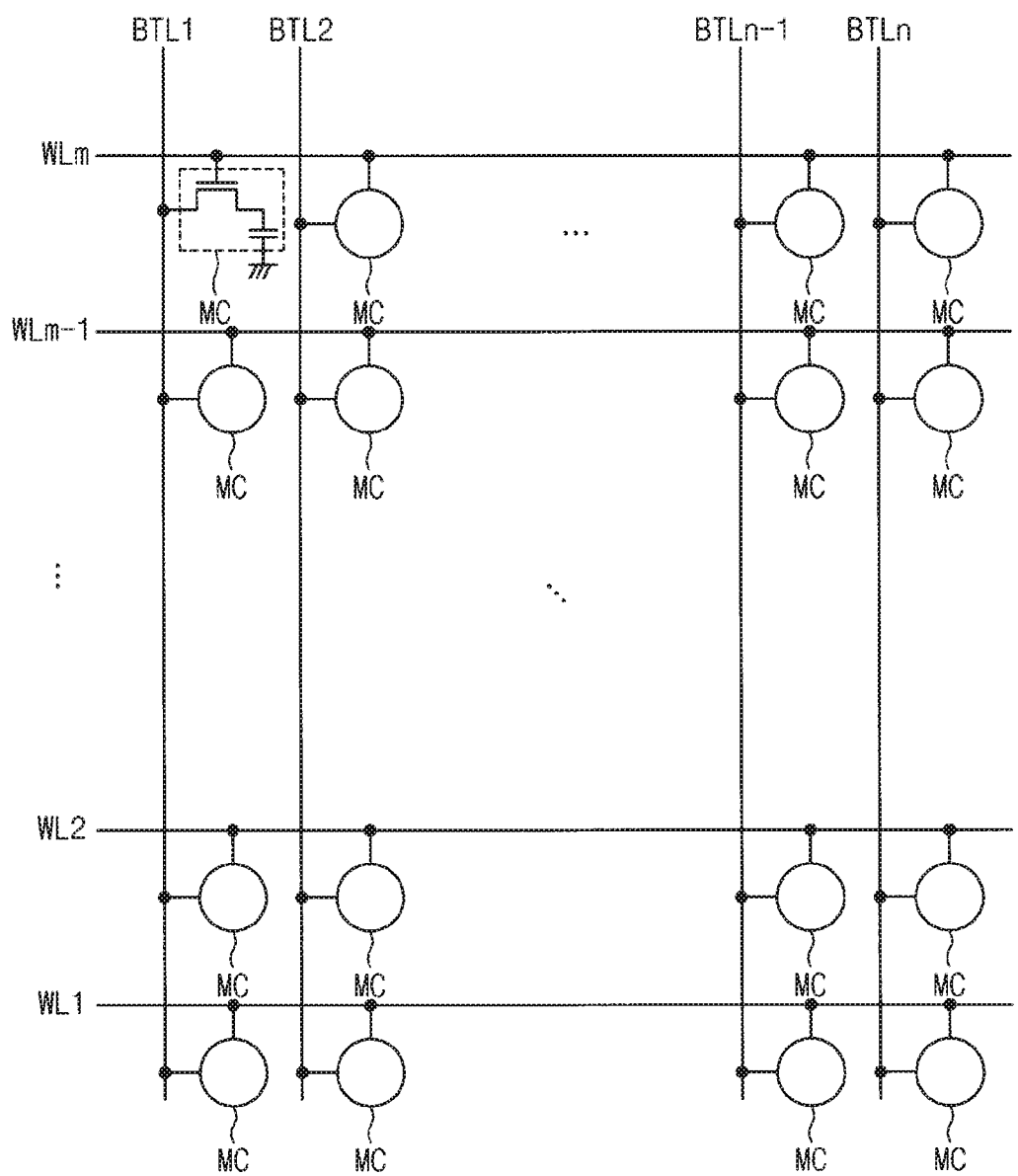
FIG. 3 illustrates a first bank array in the semiconductor memory device of FIG. 2 according to an exemplary embodiment of the inventive concept.

FIG. 3 illustrates a first bank array in the semiconductor memory device of FIG. 2 according to an exemplary embodiment of the inventive concept.

Referring to FIG. 3, the first bank array 310 includes a plurality of word-lines WL1~WLm (where m is a natural number greater than two), a plurality of bit-lines BTL1~BTLn (where n is a natural number greater than two), and a plurality of memory cells MCs disposed at intersections between the word-lines WL1~WLm and the bit-lines BTL1~BTLn. Each of the memory cells MCs includes a cell transistor coupled to one of the word-lines WL1~WLm and one of the bit-lines BTL1~BTLn, and a cell capacitor coupled to the cell transistor.

Figure 4:
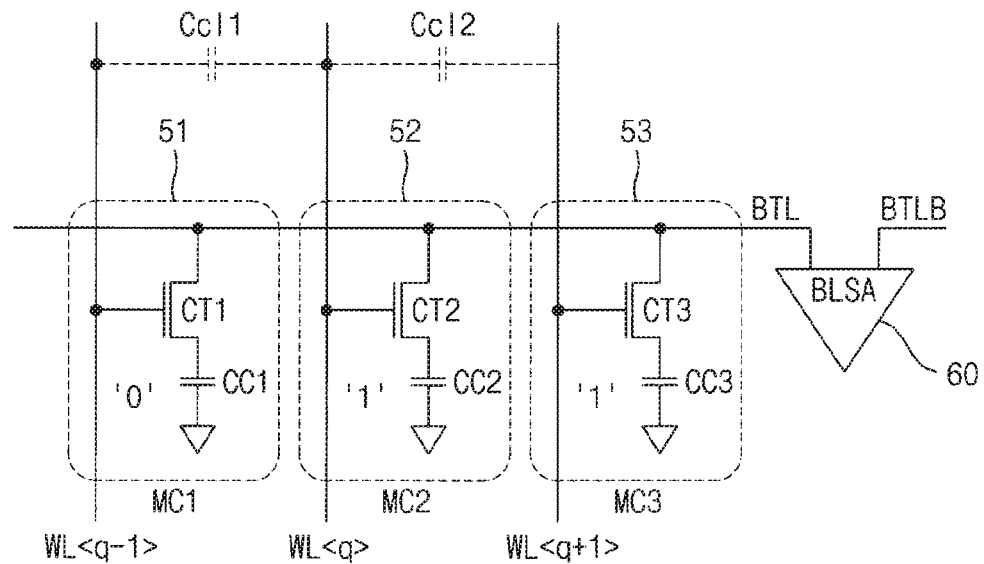
FIG. 4 is a circuit diagram illustrating disturbance between memory cells of a semiconductor memory device.

FIG. 4 is a circuit diagram illustrating disturbance between memory cells of a semiconductor memory device.

Referring to FIG. 4, a part of the semiconductor memory device 200 includes memory cells 51, 52, and 53 and a bit-line sense amplifier 60.

It is assumed that each of the memory cells 51, 52, and 53 is connected to the same bit-line BTL. In addition, the memory cell 51 is connected to a word-line WL<q−1>, the memory cell 52 is connected to a word-line WL<q>, and the memory cell 53 is connected to a word-line WL<q+1>. As shown in FIG. 4, the word-lines WL<q−1> and WL<q+1> are located adjacent to the word-line WL<q>. The memory cell 51 includes an access transistor CT1 and a cell capacitor CC1. A gate terminal of the access transistor CT1 is connected to the word-line WL<q−1> and one terminal is connected to the bit-line BTL. The memory cell 52 includes an access transistor CT2 and a cell capacitor CC2. A gate terminal of the access transistor CT2 is connected to the word-line WL<q> and one terminal is connected to the bit-line BTL. Additionally, the memory cell 53 includes an access transistor CT3 and a cell capacitor CC3. A gate terminal of the access transistor CT3 is connected to the word-line WL<q+1> and one terminal is connected to the bit-line BTL.

The bit-line sense amplifier 60 may include an N sense amplifier discharging a low level bit line among bit lines BTL and BTLB and a P sense amplifier charging a high level bit line among the bit lines BTL and BTLB.

During a refresh operation, the bit-line sense amplifier 60 rewrites data stored through the N sense amplifier or the P sense amplifier in a selected memory cell. During a read operation or a write operation, a select voltage (for example, Vpp) is provided to the word-line WL<q>. Then, due to a capacitive coupling effect, a voltage of adjacent word-lines WL<q−1> and WL<q+1> rises even when no select voltage is applied. Such capacitive coupling is indicated with parasitic capacitances Ccl1 and Ccl2.

When the refresh operation is not performed and the word-line WL<q> is accessed repeatedly, charges stored in the cell capacitors CC1 and CC3 of the memory cells 51 and 53 connected to the word-lines WL<q−1> and WL<q+1> may leak gradually. In this case, the reliability of a logic '0' stored in the cell capacitor CC1 and a logic '1' stored in the cell capacitor CC3 may not be guaranteed. Therefore, a scrubbing operation on the memory cells may be needed at an appropriate time.

Figure 5:
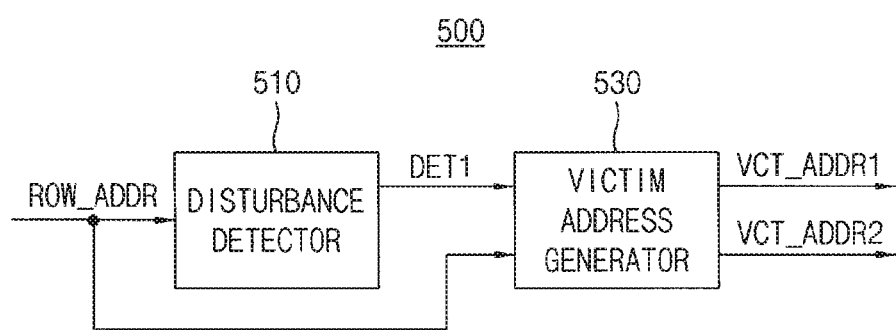
FIG. 5 is a block diagram illustrating a victim address detector in the semiconductor memory device of FIG. 2 according to an exemplary embodiment of the inventive concept.

FIG. 5 is a block diagram illustrating a victim address detector in the semiconductor memory device of FIG. 2 according to an exemplary embodiment of the inventive concept.

Referring to FIG. 5, the victim address detector 500 may include a disturbance detector 510 and a victim address generator 530.

The disturbance detector 510 may count a number of accesses to the first memory region based on the row address ROW_ADDR and may generate a first detection signal DET1 when the number of the counted accesses reaches the reference value during a reference (or predetermined) interval.

The victim address generator 530 may generate the at least one victim address VCT_ADDR1 and VCT_ADDR2 in response to the first detection signal DET1. The at least one victim address VCT_ADDR1 and VCT_ADDR2 may be a row address designating a second memory region and a third memory region which are located adjacent to the first memory region. The victim address generator 530 may provide the at least one victim address VCT_ADDR1 and VCT_ADDR2 to the weak address table 560.

Figure 6:
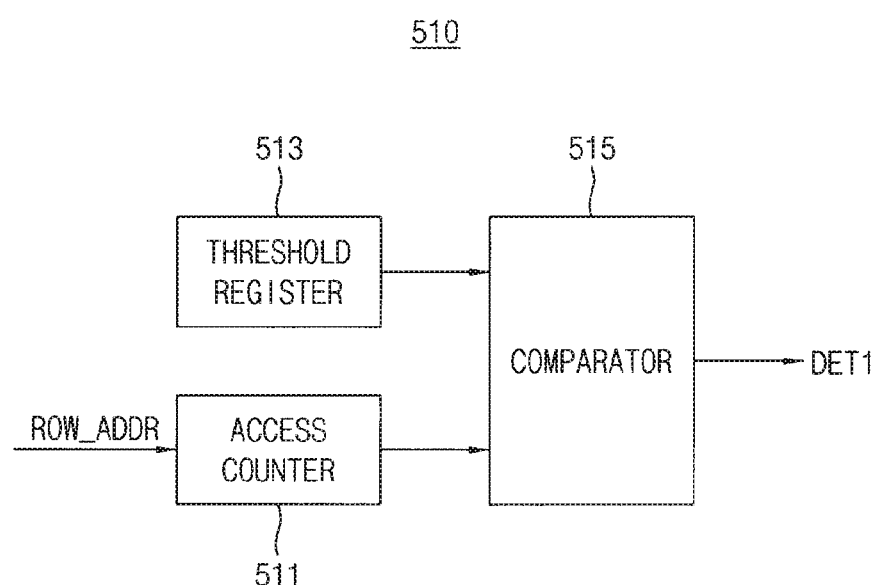
FIG. 6 is a block diagram illustrating a disturbance detector in the victim address detector of FIG. 5 according to an exemplary embodiment of the inventive concept.

FIG. 6 is a block diagram illustrating a disturbance detector in the victim address detector of FIG. 5 according to an exemplary embodiment of the inventive concept.

Referring to FIG. 6, the disturbance detector 510 may include an access counter 511, a threshold register 513, and a comparator 515.

The access counter 511 may count a number of accesses to a specified address (or a specified memory region) based on the row address ROW_ADDR. For example, the access counter 511 may count a number of accesses to a specified word-line. The number of accesses may be counted on a specific word-line or a word-line group including at least two word-lines. Moreover, a count of the number of accesses may be performed by a specific block unit, a bank unit, or a chip unit.

The threshold register 513 may store a maximum disturbance occurrence count that guarantees the reliability of data in a specific word-line or a memory unit. For example, a threshold (or a reference value) on one word-line may be stored in the threshold register 513. Alternatively, a threshold on one word line group, one block, one bank unit, or one chip unit may be stored in the threshold register 513.

The comparator 515 may compare the reference value stored in the threshold register 513 with the number of accesses to the specified memory region counted by the access counter 511. If there is a memory region where the counted number of accesses reaches the reference value, the comparator 515 generates the first detection signal DET1. The comparator 515 provides the first detection signal DET1 to the victim address generator 530.

Figure 7:
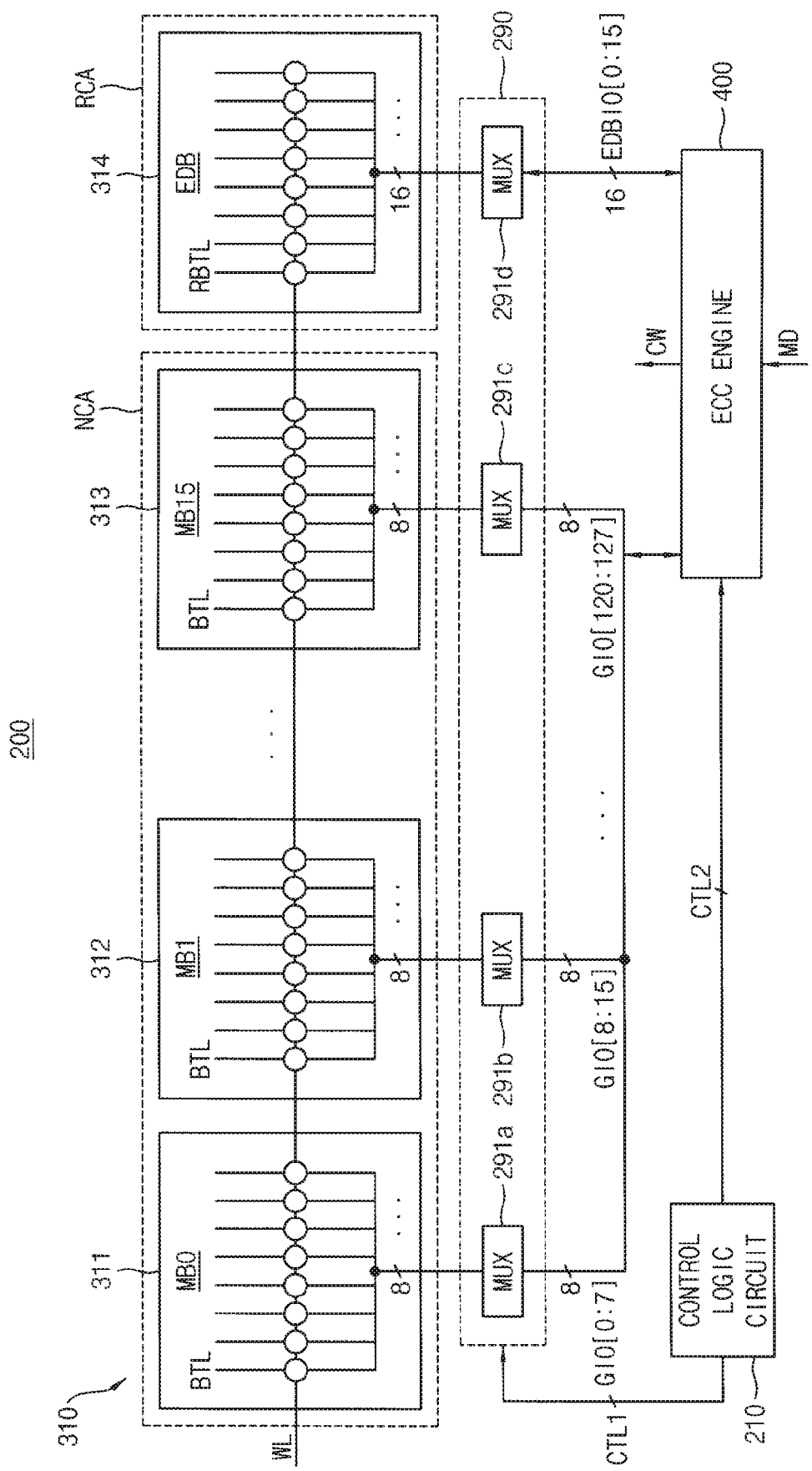
FIG. 7 illustrates a portion of the semiconductor memory device of FIG. 2 in a write operation according to an exemplary embodiment of the inventive concept.

FIG. 7 illustrates a portion of the semiconductor memory device of FIG. 2 in a write operation according to an exemplary embodiment of the inventive concept.

In FIG. 7, the control logic circuit 210, the first bank array 310, the I/O gating circuit 290, and the ECC engine 400 are illustrated.

Referring to FIG. 7, the first bank array 310 includes a normal cell array NCA and a redundancy cell array RCA.

The normal cell array NCA includes a plurality of first memory blocks MB0~MB15, e.g., 311~313, and the redundancy cell array RCA includes at least a second memory block 314. The first memory blocks 311~313 are memory blocks determining a memory capacity of the semiconductor memory device 200.

The second memory block 314 is for ECC and/or redundancy repair. Since the second memory block 314 for ECC and/or redundancy repair is used for ECC, data line repair, and block repair to repair 'fail' cells generated in the first memory blocks 311~313, the second memory block 314 is also referred to as an EDB block.

In each of the first memory blocks 311~313, a plurality of first memory cells are arranged in rows and columns. In the second memory block 314, a plurality of second memory cells are arranged in rows and columns. The first memory cells connected to intersections of the word-lines WL and the bit-lines BTL may be dynamic memory cells. The second memory cells connected to intersections of the word-lines WL and bit-lines RBTL may also be dynamic memory cells.

The I/O gating circuit 290 includes a plurality of switching circuits 291a~291d respectively connected to the first memory blocks 311~313 and the second memory block 314. In the semiconductor memory device 200, bit-lines corresponding to data of a burst length (BL) may be simultaneously accessed to support the BL indicating the maximum number of column positions that is accessible. For example, the BL may be set to 8.

The ECC engine 400 may be connected to the switching circuits 291a~291d through first data lines GIO[0:127] and second data lines EDBIO[0:15].

The control logic circuit 210 may receive the command CMD and the address ADDR, and may decode the command CMD to generate the first control signal CTL1 for controlling the switching circuits 291a~291d and the second control signal CTL2 for controlling the ECC engine 400.

When the command CMD is a write command, the control logic circuit 210 provides the second control signal CTL2 to the ECC engine 400, and the ECC engine 400 performs the s-bit ECC encoding on the main data MD to generate parity bits associated with the main data MD and provides the I/O gating circuit 290 with the codeword CW including the main data MD and the parity bits. The control logic circuit 210 provides the first control signal CTL1 to the I/O gating circuit 290 such that the codeword CW is to be stored in a sub-page of the target page in the first bank array 310.

Figure 8:
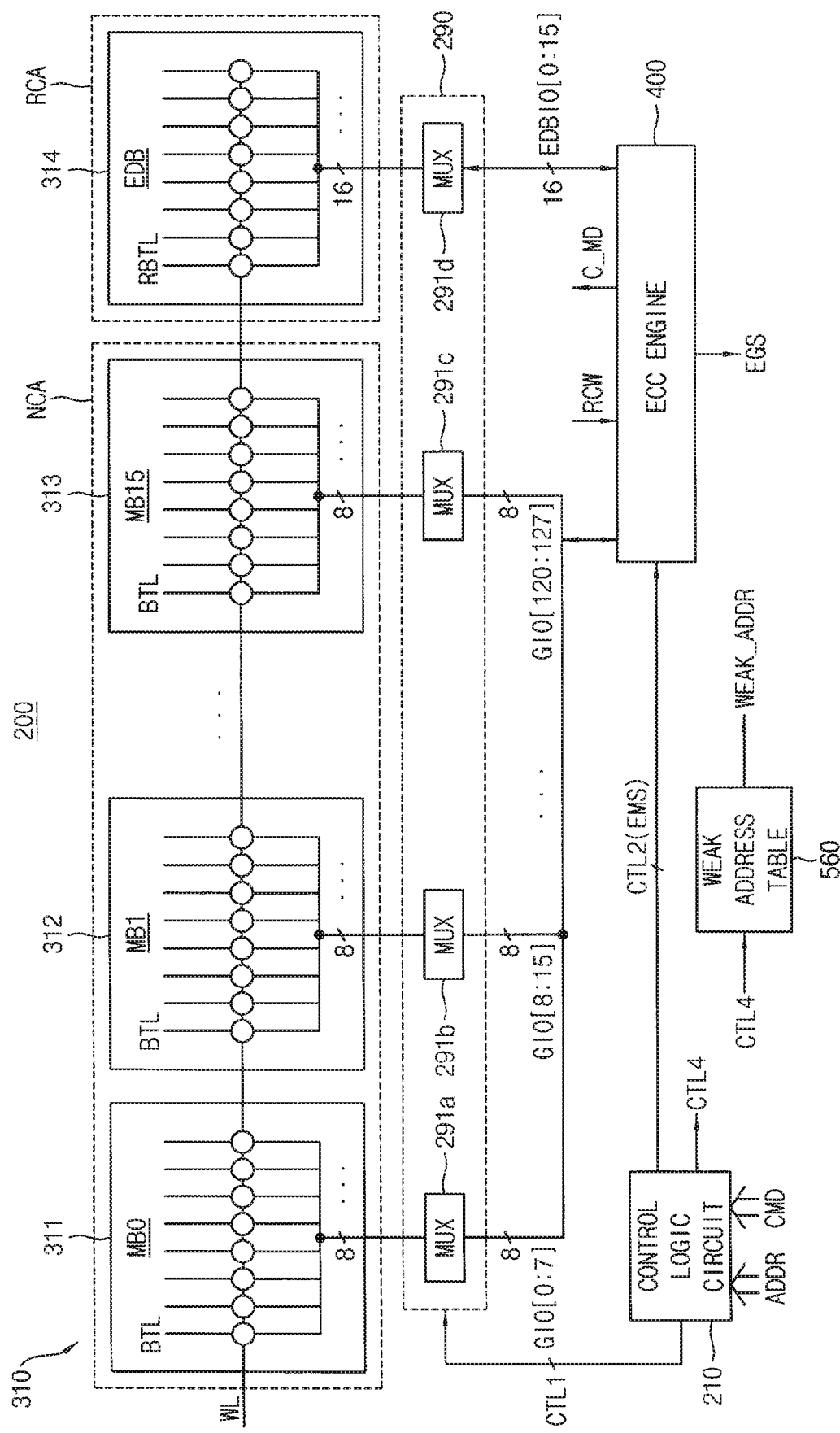
FIG. 8 illustrates a portion of the semiconductor memory device of FIG. 2 in a read operation or a refresh operation according to an exemplary embodiment of the inventive concept.

FIG. 8 illustrates a portion of the semiconductor memory device of FIG. 2 in a read operation or a refresh operation according to an exemplary embodiment of the inventive concept.

In FIG. 8, the control logic circuit 210, the first bank array 310, the I/O gating circuit 290, the ECC engine 400, and the weak address table 560 are illustrated.

Referring to FIG. 8, when the command CMD is a read command to designate a read operation or a refresh command to designate a refresh operation, the control logic circuit 210 provides the first control signal CTL1 to the I/O gating circuit 290 such that a first codeword (e.g., a read codeword RCW) stored in the sub-page of the target page in the first bank array 310 is provided to the ECC engine 400, and provides the second control signal CTL2 as an error mode signal EMS to the ECC engine 400.

In the read operation, the ECC engine 400 performs the t-bit ECC decoding on the codeword RCW and provides the error generation signal EGS to the control logic circuit 210. The control logic circuit 210 may store an address (e.g., a row address and a column address) of the read codeword RCW in the weak address table 560 as the error address EADDR.

In the refresh operation on weak pages designated by the weak address WEAK_ADDR, the ECC engine 400 performs the s-bit ECC decoding on the read codeword RCW. When the read codeword RCW includes at least one error bit, the ECC engine 400 performs the scrubbing operation to correct the at least one error bit, and to write back corrected main data C_MD in the sub-page.

When an error bit is detected during the scrubbing operation, the ECC engine 400 may provide the error generation signal EGS to the control logic circuit 210 whenever the error bit is detected. The ECC engine 400 counts a number of the error generation signals EGS with respect to one page, and stores an address of the one page in the weak address table 560 as the error address EADDR when the counted value exceeds the threshold value.

Figure 9:
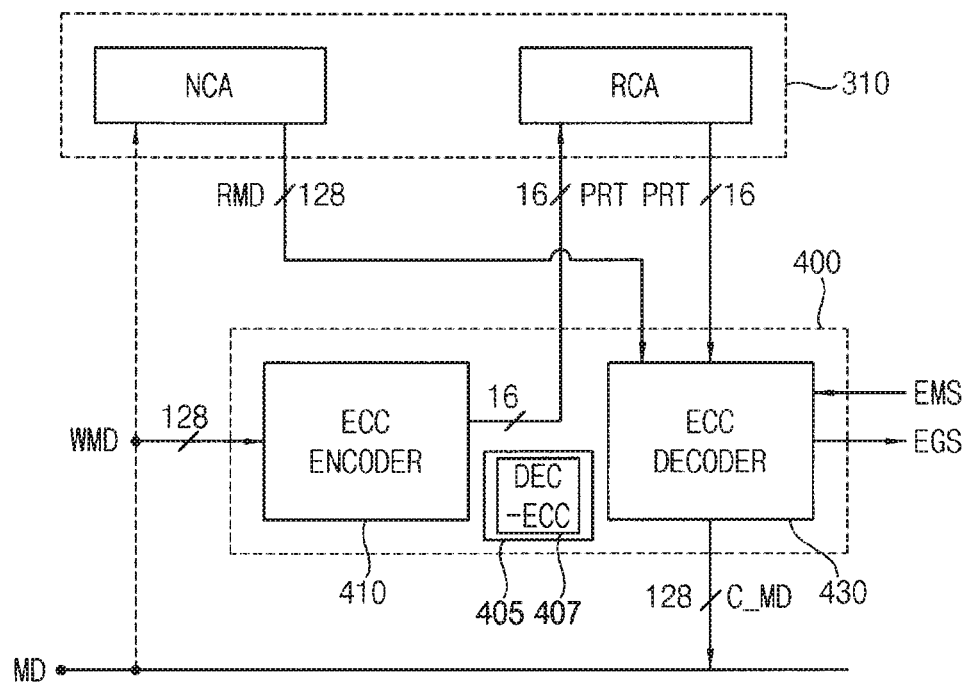
FIG. 9 is a block diagram illustrating an ECC engine in the semiconductor memory device of FIG. 2 according to an exemplary embodiment of the inventive concept.

FIG. 9 is a block diagram illustrating an ECC engine in the semiconductor memory device of FIG. 2 according to an exemplary embodiment of the inventive concept.

Referring to FIG. 9, the ECC engine 400 includes an ECC encoder 410, an ECC decoder 430, and a memory 405. The memory 405 may store a DEC-ECC 407 and may provide the DEC-ECC 407 to the ECC encoder 410 and the ECC decoder 430.

The ECC encoder 410 may generate parity bits PRT associated with a write data WMD to be stored in the normal cell array NCA of the first bank array 310. The parity bits PRT may be stored in the redundancy cell array RCA of the first bank array 310.

The ECC decoder 430 may perform the t-bit ECC decoding or the s-bit ECC decoding on read data RMD (e.g., the read codeword RCW) using the parity bits PRT read from the first bank array 310 in response to the error mode signal EMS, and may output the corrected main data C_MD and the error generation signal EGS.

Figure 10:
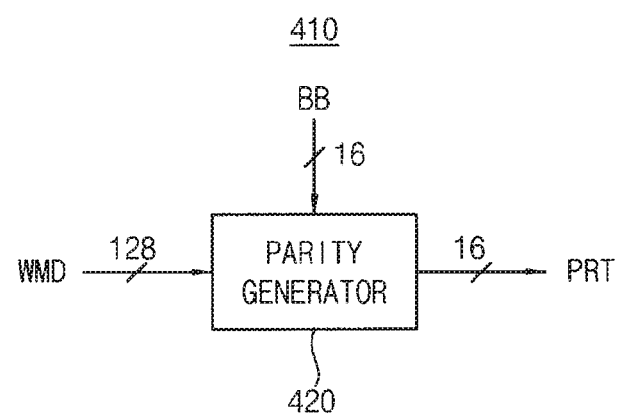
FIG. 10 illustrates an ECC encoder in the ECC engine of FIG. 9 according to an exemplary embodiment of the inventive concept.

FIG. 10 illustrates an ECC encoder in the ECC engine of FIG. 9 according to an exemplary embodiment of the inventive concept.

Referring to FIG. 10, the ECC encoder 410 may include a parity generator 420. The parity generator 420 receives the 128-bit write data WMD and a 16-bit basis bit BB, and generates the 16-bit parity bits PRT by performing, for example, an XOR array operation. The basis bit BB is bits for generating the parity bits PRT with respect to the 128-bit write data WMD and may include b'0000000000000000. The basis bit BB may include other particular bits instead of b'0000000000000000.

Figure 11:
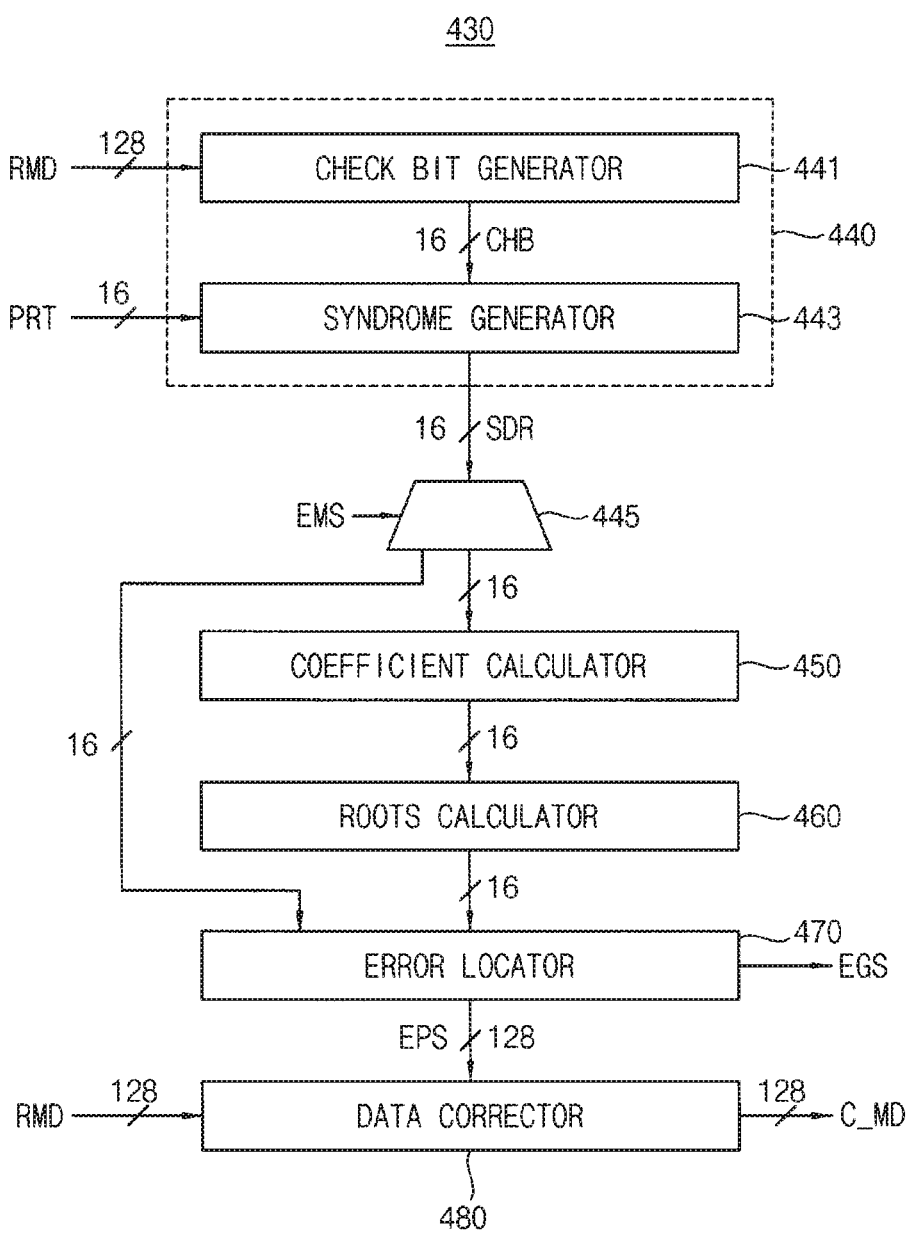
FIG. 11 illustrates an ECC decoder in the ECC engine of FIG. 9 according to an exemplary embodiment of the inventive concept.

FIG. 11 illustrates an ECC decoder in the ECC engine of FIG. 9 according to an exemplary embodiment of the inventive concept.

Referring to FIG. 11, the ECC decoder 430 may include a syndrome generation circuit 440, a selection circuit 445, a coefficient calculator 450, a roots calculator 460, an error locator 470, and a data corrector 480. The syndrome generation circuit 440 may include a check bit generator 441 and a syndrome generator 443.

The check bit generator 441 generates check bits CHB based on the read data RMD by performing an XOR array operation, and the syndrome generator 443 generates a syndrome SDR by comparing corresponding bits of the parity bits PRT and the check bits CHB.

The selection circuit 445 may provide the syndrome SDR to one of the coefficient calculator 450 and the error locator 470 in response to the error mode signal EMS. When the ECC engine 400 performs the s-bit ECC decoding, the selection circuit 445 provides the syndrome SDR to the coefficient calculator 450, and when the ECC engine 400 performs the t-bit ECC decoding, the selection circuit 445 provides the syndrome SDR to the error locator 470.

The coefficient calculator 450 mat calculate coefficients of an error polynomial by using the syndrome SDR. The roots calculator 460 may calculate roots of the error polynomial by using the calculated coefficients. The error locator 470 may decode the syndrome SDR or the roots to provide the data corrector 480 with an error position signal EPS indicating a position of an error bit in the read data RMD when all bits of the syndrome SDR are not zero or when the roots are not zero. The error locator 470 may provide the error generation signal EGS to the control logic circuit 210 when the read data RMD includes the error bit.

The data corrector 480 receives the read data RMD, corrects the error bit in the read data RMD based on the error position signal EPS when the read data RMD includes the error bit, and outputs the corrected main data C_MD. When the ECC engine 400 performs the t-bit ECC decoding, the data corrector 480 provides the corrected main data C_MD to the memory controller 100 through the data I/O buffer 295. When the ECC engine 400 performs the s-bit ECC decoding, the data corrector 480 writes back the corrected main data C_MD in the sub-page through the I/O gating circuit 290.

Figure 12:
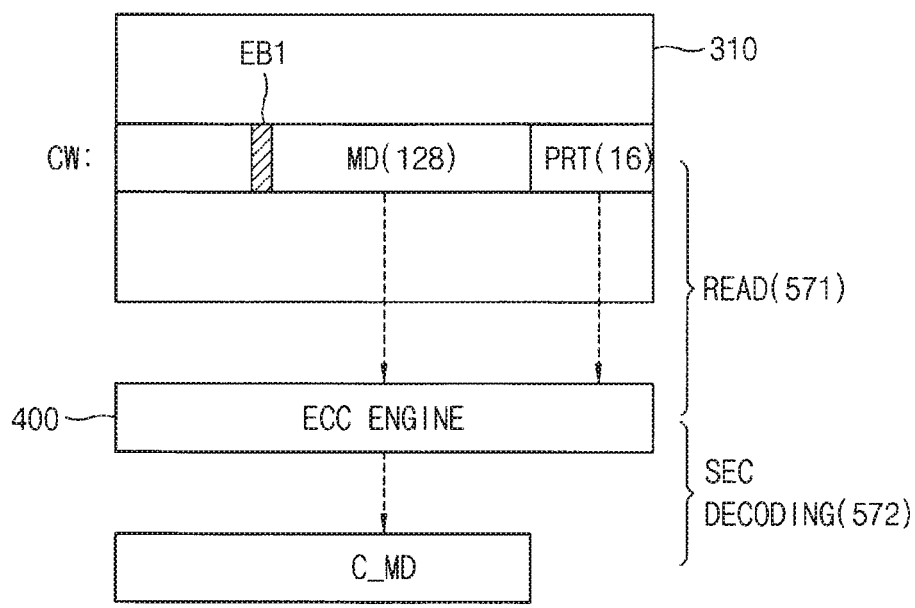
FIG. 12 illustrates an operation of the ECC decoder of FIG. 11 in a read operation according to an exemplary embodiment of the inventive concept.

FIG. 12 illustrates an operation of the ECC decoder of FIG. 11 in a read operation according to an exemplary embodiment of the inventive concept.

Referring to FIGS. 11 and 12, it is assumed that the codeword CW includes a first error bit EB1. The codeword CW is read from a first page and is provided to the ECC engine 400 (571). The ECC engine 400 performs the t-bit ECC decoding on the codeword CW to provide the corrected main data C_MD to the data I/O buffer 295 (572). Here, "t" corresponds to one and the t-bit ECC decoding may correspond to single error correction (SEC) ECC decoding capable of correcting one error bit.

Figure 13:
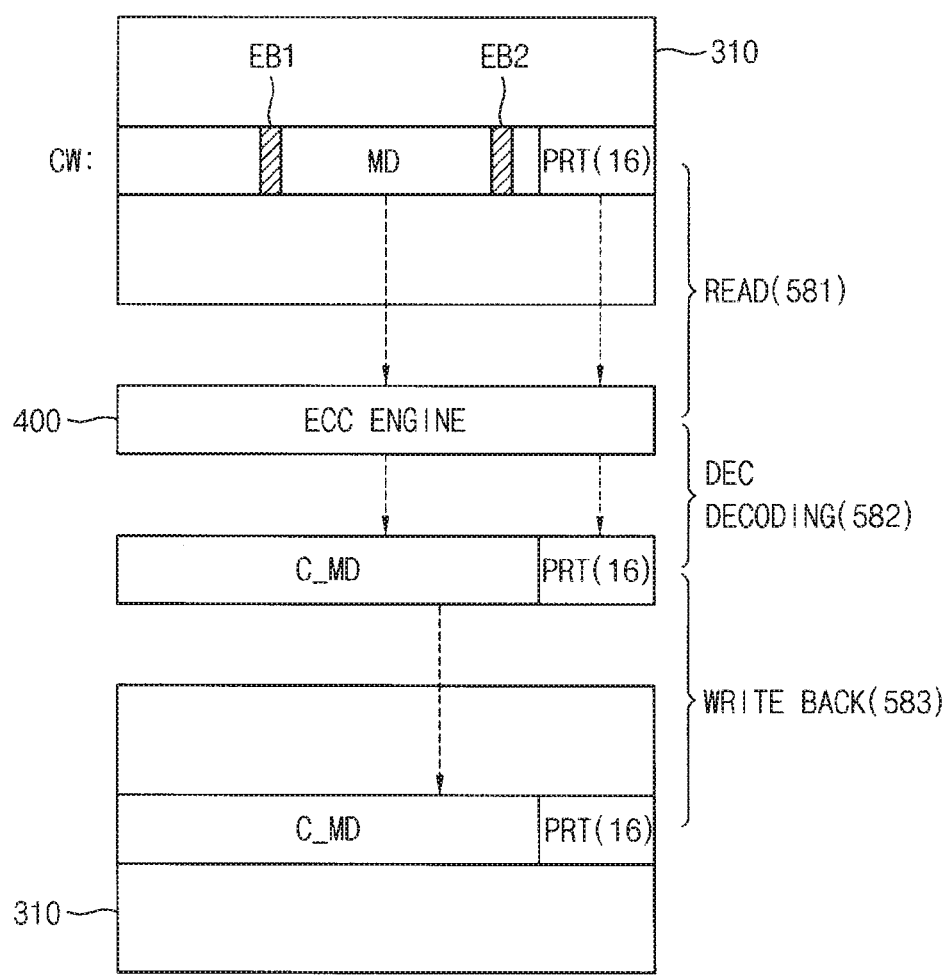
FIG. 13 illustrates an operation of the ECC decoder of FIG. 11 in a scrubbing operation according to an exemplary embodiment of the inventive concept.

FIG. 13 illustrates an operation of the ECC decoder of FIG. 11 in a scrubbing operation according to an exemplary embodiment of the inventive concept.

Referring to FIGS. 11 and 13, in a scrubbing operation in response to a refresh command, the codeword CW includes a first error bit EB1 and a second error bit EB2. The codeword CW is read from a second page and is provided to the ECC engine 400 (581). The ECC engine 400 performs the s-bit ECC decoding on the codeword CW to correct the first error bit EB1 and the second error bit EB2 (582) and writes back the corrected main data C_MD in a sub-page of the second page (583). Here, "s" corresponds to two and the s-bit ECC decoding may correspond to double error correction (DEC) ECC decoding capable of correcting two error bits.

Figure 14:
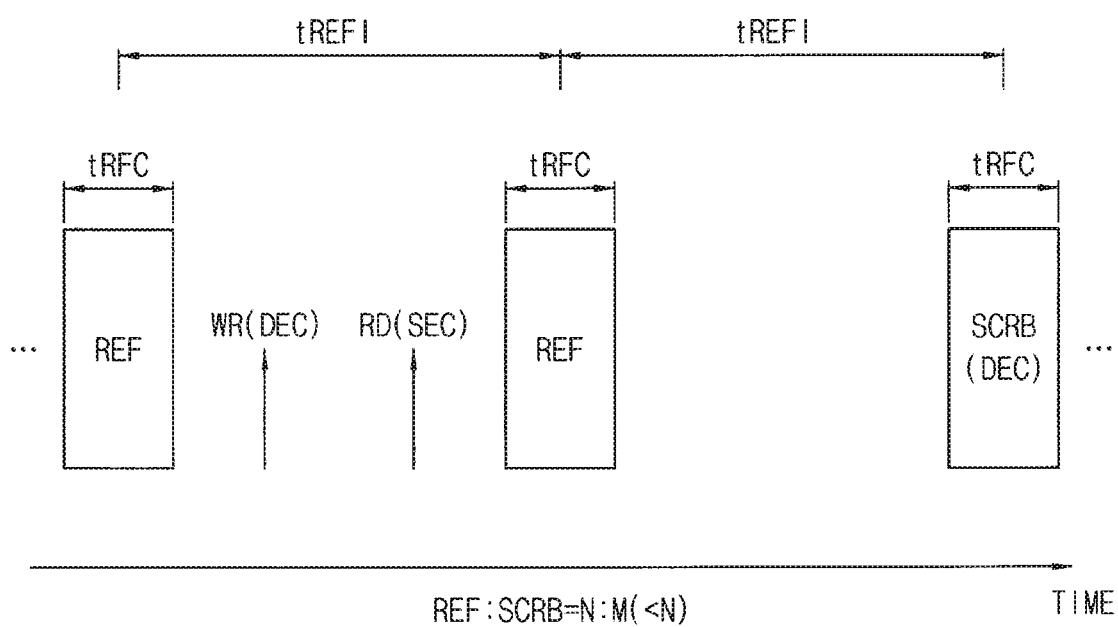
FIG. 14 illustrates a normal refresh operation and a scrubbing operation in the semiconductor memory device of FIG. 2 according to an exemplary embodiment of the inventive concept.

FIG. 14 illustrates a normal refresh operation and a scrubbing operation in the semiconductor memory device of FIG. 2 according to an exemplary embodiment of the inventive concept.

In FIG. 14, tRFC denotes a refresh cycle and refers to a time required for refreshing one row, and tREFI denotes a refresh interval and refers to an interval between two consecutive refresh commands.

Referring to FIG. 14, the ECC engine 400 may perform the scrubbing operation SCRB M-times on a row designated by the weak address WEAK_ADDR stored in the weak address table 560, while a normal refresh operation REF is performed on rows N-times in response to the refresh command applied to the semiconductor memory device 200. Here, N is a natural number greater than one and M is a natural number smaller than N.

In FIG. 14, the s-bit ECC encoding is performed in response to a write command WR and the t-bit ECC decoding is performed in response to the read command RD.

Figure 15:
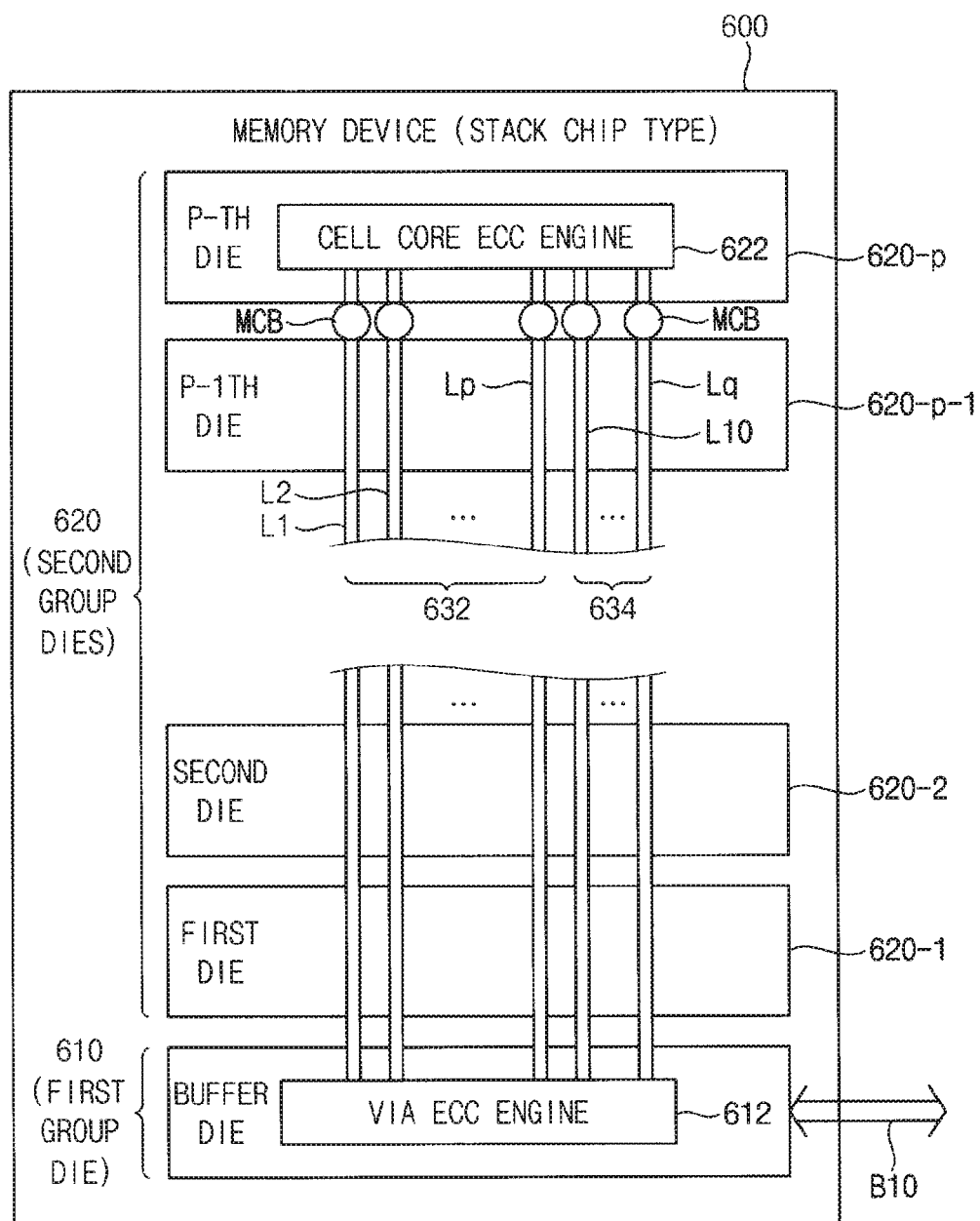
FIG. 15 is a block diagram illustrating a semiconductor memory device according to an exemplary embodiment of the inventive concept.

FIG. 15 is a block diagram illustrating a semiconductor memory device according to an exemplary embodiment of the inventive concept.

Referring to FIG. 15, a semiconductor memory device 600 may include first group die 610 and second group dies 620 providing a soft error analyzing and correcting function in a stacked chip structure.

The first group die 610 may include at least one buffer die. The second group dies 620 may include a plurality of memory dies 620-1 to 620-p which are stacked on the first group die 610 and convey data through a plurality of through silicon via (TSV) lines.

At least one of the memory dies 620-1 to 620-p may include a first type ECC engine 622 which generates transmission parity bits (e.g., transmission parity data) based on transmission data to be sent to the first group die 610. The first type ECC engine 622 may be referred to as "cell core ECC engine." The first type ECC engine 622 may employ the ECC engine of FIG. 9.

The buffer die 610 may include a second type ECC engine 612 which corrects a transmission error using the transmission parity bits when a transmission error is detected from the transmission data received through the TSV lines and generates error-corrected data. The second type ECC engine 612 may be referred to as 'via ECC engine'.

The semiconductor memory device 600 may be a stack chip type memory device or a stacked memory device which conveys data and control signals through the TSV lines. The TSV lines may be also called "through electrodes."

As mentioned above, the first type ECC engine 622 may perform one of the t-bit ECC decoding and the s-bit ECC decoding that are capable of correcting different error bits in response to the command CMD from the memory controller 100 and may reduce an overhead of the ECC decoding.

The first type ECC engine 622 may perform error correction on data which is outputted from the memory die 620-p before the transmission data is sent.

A transmission error which occurs in the transmission data may be due to noise which occurs at the TSV lines. Since data fail due to noise occurring at the TSV lines may be distinguishable from data fail due to a false operation of the memory die, it may be regarded as a soft data fail (or a soft error). The soft data fail may be generated due to transmission fail on a transmission path, and may be detected and remedied by an ECC operation.

For example, when the transmission data is 128-bit data, the transmission parity bits may be set to 16 bits. However, the inventive concepts is not limited thereto, and the number of transmission parity bits may be increased or decreased.

Based on the above description, a TSV line group 632 which is formed at one memory die 620-p may include 64 TSV lines L1 to Lp, and a parity TSV line group 634 may include 16 TSV lines L10 to Lq.

The TSV lines L1 to Lp of the data TSV line group 632 and the parity TSV lines L10 to Lq of the parity TSV line group 634 may be connected to micro bumps MCB which are correspondingly formed among the memory dies 620-1 to 620-p.

At least one of the memory dies 620-1 to 620-p may include DRAM cells each including at least one access transistor and one storage capacitor.

The semiconductor memory device 600 may have a three-dimensional (3D) chip structure or a 2.5D chip structure to communicate with the host through a data bus B10. The buffer die 610 may be connected with the memory controller through the data bus B10.

The first type ECC engine 622, denoted as the cell core ECC engine, may output the transmission parity bits and the transmission data through the parity TSV line group 634 and the data TSV line group 632, respectively. The outputted transmission data may be data which is error-corrected by the first type ECC engine 622.

The second type ECC engine 612, denoted as the via ECC engine, may determine whether a transmission error occurs at the transmission data received through the data TSV line group 632, based on the transmission parity bits received through the parity TSV line group 634. When a transmission error is detected, the second type ECC engine 612 may correct the transmission error at the transmission data using the transmission parity bits. When the transmission error is uncorrectable, the second type ECC engine 612 may output information indicating occurrence of an uncorrectable data error.

When an error is detected from read data in a high-bandwidth memory (HBM) or the stacked memory structure, the error is an error occurring due to noise while data is transmitted through the TSV lines.

According to an exemplary embodiment of the inventive concept, as illustrated in FIG. 15, the cell core ECC engine 622 may be included in the memory die, and the via ECC engine 612 may be included in the buffer die. Accordingly, it may be possible to detect and correct soft data fail. The soft data fail may include a transmission error which is generated due to noise when data is transmitted through the TSV lines.

Figure 16:
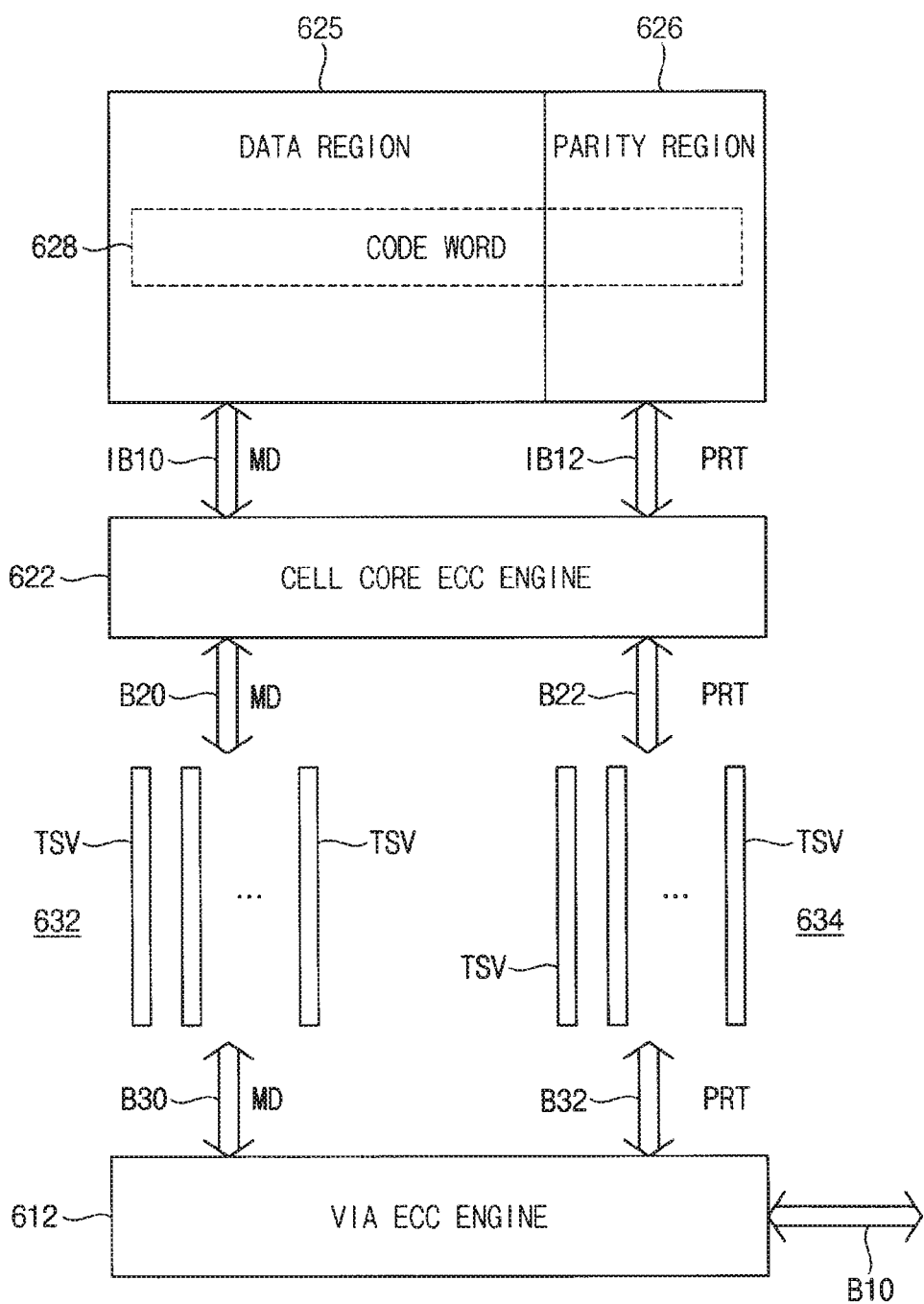
FIG. 16 is a diagram schematically illustrating connections between ECC engines in FIG. 15 according to an exemplary embodiment of the inventive concept.

FIG. 16 is a diagram schematically illustrating connections between ECC engines in FIG. 15 according to an exemplary embodiment of the inventive concept.

Referring to FIG. 16, the cell core ECC engine 622 and the via ECC engine 612 may be connected through the data TSV line group 632 and the parity TSV line group 634.

More particularly, one memory die may include a memory cell array, and the memory cell array may include a data region 625 storing the main data MD and a parity region 626 storing the parity bits PRT.

In the case of reading data, a code word 628 may include the main data MD from the data region 625 and the parity bits PRT from the parity region 626. The cell core ECC engine 622 may receive the main data MD through an internal data bus IB10 and the parity bits PRT through an internal parity bus IB12. The cell core ECC engine 622 may check a read error on the main data MD using the parity bits PRT and may perform error correction based on the checking result.

The cell core ECC engine 622 may output the error-corrected data as transmission data through a data bus B20 and may output transmission parity data through the parity bus B22. Here, the transmission parity data may be the same information as the parity bits PRT.

The via ECC engine 612 may receive the transmission data through a data bus B30 and the transmission parity data through a parity bus B32. The data bus B20 and the data bus B30 may be implemented with the data TSV line group 632 described with reference to FIG. 15. The parity bus B22 and the parity bus B32 may be implemented with the parity TSV line group 634 described with reference to FIG. 15.

The via ECC engine 612 may perform error checking on the transmission data received through the data TSV line group 632, based on the transmission parity data received through the parity TSV line group 634. When a transmission error is detected through the error checking, the second type ECC engine 612 may correct the transmission error on the transmission data, based on the transmission parity data. For example, in the case where the number of correctable data bits is one, error correction may be impossible when a transmission error including two or more error bits occurs.

In this case, the second type ECC engine 612 may output information indicating occurrence of a data error to the data bus B10.

In an exemplary embodiment of the inventive concept, the via ECC engine 612 may employ the ECC engine 400 of FIG. 9.

Figure 17:
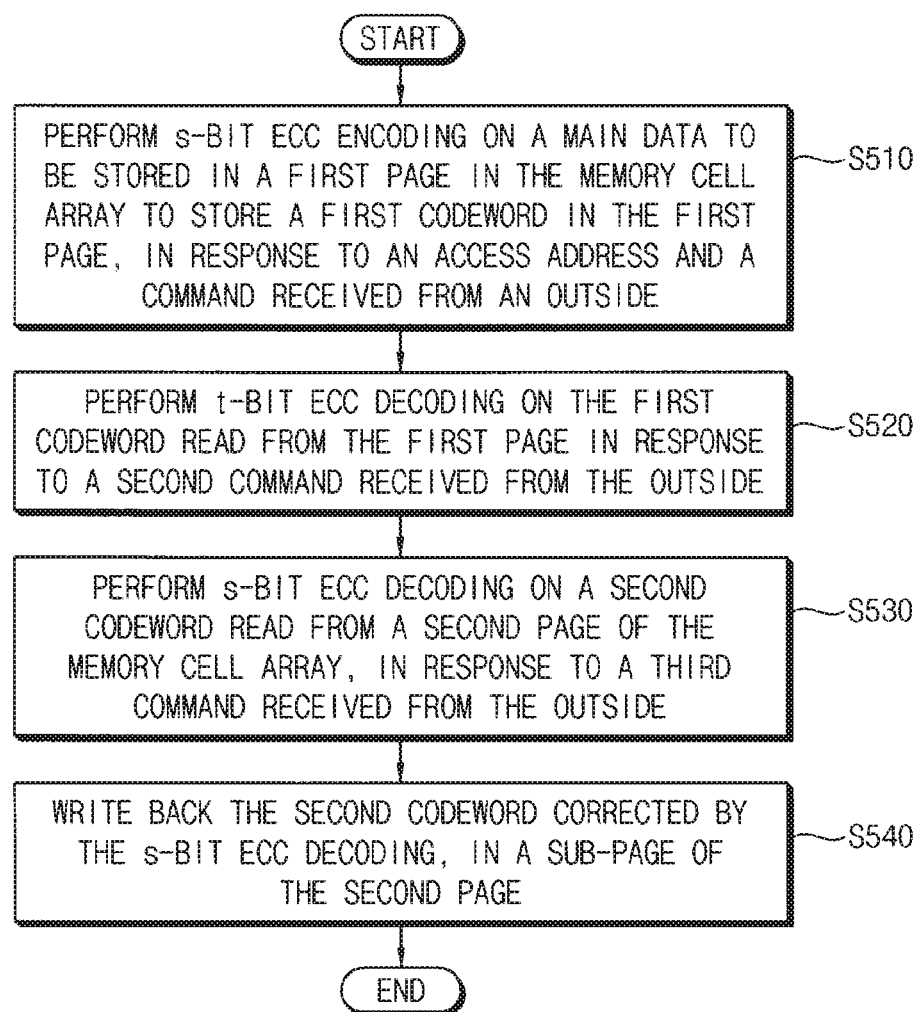
FIG. 17 is a flowchart illustrating a method of operating a semiconductor memory device according to an exemplary embodiment of the inventive concept.

FIG. 17 is a flowchart illustrating a method of operating a semiconductor memory device according to an exemplary embodiment of the inventive concept.

Referring to FIGS. 1 through 17, in a method of operating the semiconductor memory device 200 including the memory cell array 300 that has a plurality of dynamic memory cells, the ECC engine 400 performs the s-bit ECC encoding on the main data MD in response to the access address ADDR and the first command from the memory controller 100 to store a first codeword in a first page of the memory cell array 300 (S510). Here, "s" is a natural number greater than one.

The ECC engine 400 performs the t-bit ECC decoding on the first codeword read from the first page in response to the second command from the memory controller 100 (S520). Here, "t" is a natural number smaller than "s."

The ECC engine 400 performs the s-bit ECC decoding on a second codeword read from a second page in response to the third command from the memory controller 100 (S530). The ECC engine 400 may write back the corrected main data C_MD, whose error bits are corrected by the s-bit ECC decoding, in a sub-page in the second page (S540).

Figure 18:
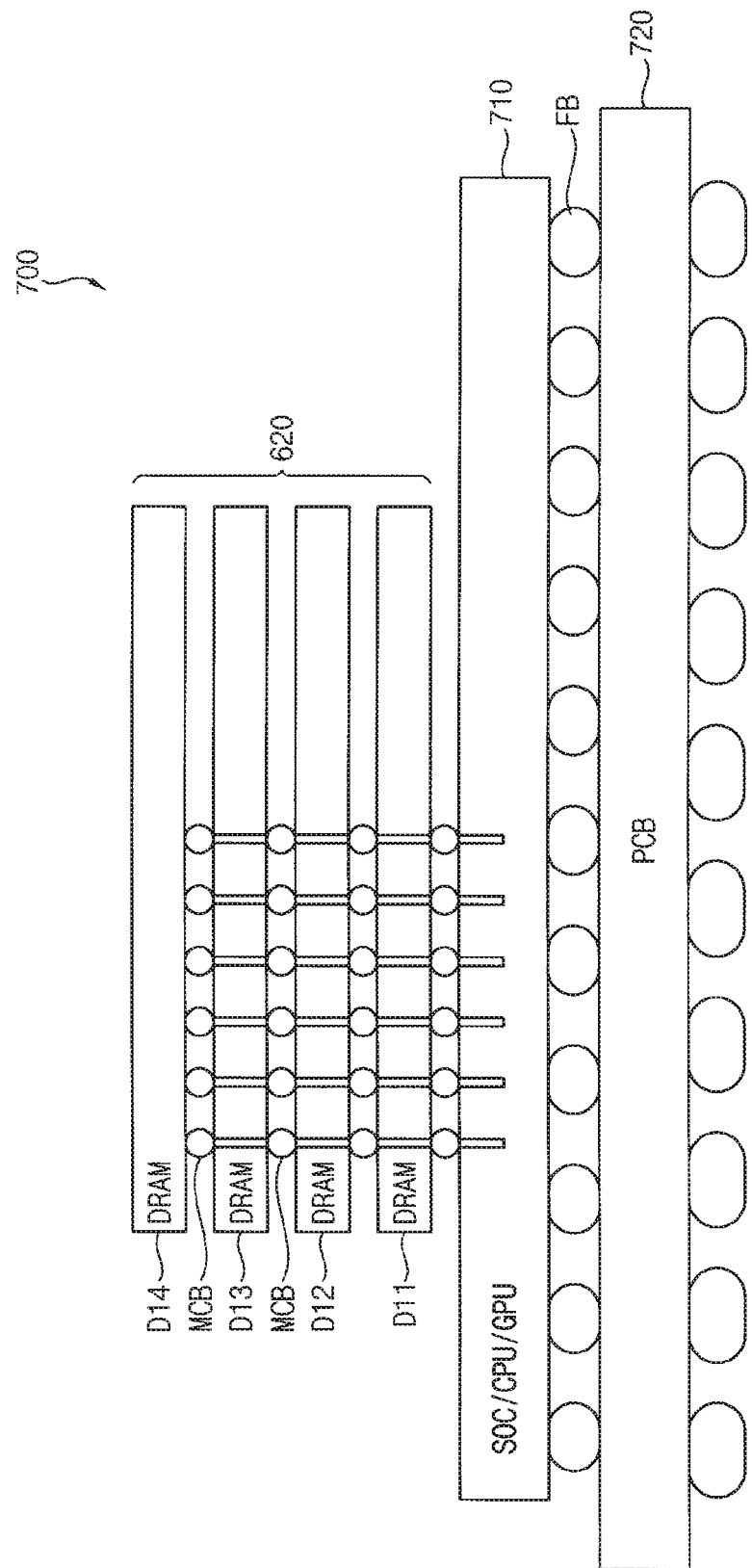
FIG. 18 is a cross-sectional view of a 3D chip structure employing the semiconductor memory device of FIG. 15 according to an exemplary embodiment of the inventive concept.

FIG. 18 is a cross-sectional view of a 3D chip structure employing the semiconductor memory device of FIG. 15 according to an exemplary embodiment of the inventive concept.

FIG. 18 shows a 3D chip structure 700 in which a host and a HBM are directly connected without an interposer layer.

Referring to FIG. 18, a host die 710 such as a system-on-chip (SoC), a central processing unit (CPU), or a graphic processing unit (GPU) may be disposed on a printed circuit board (PCB) 720 using flip chip bumps FB. Memory dies D11 to D14 may be stacked on the host die 720 to implement the second group dies 620 having an HBM structure. In FIG. 17, the buffer die 610 or a logic die of FIG. 14 is omitted. However, the buffer die 610 or the logic die may be disposed between the memory die D11 and the host die 710. To implement the HBM structure, TSV lines may be formed at the memory dies D11 and D14. The TSV lines may be electrically connected with micro bumps MCB placed between memory dies.

Figure 19:
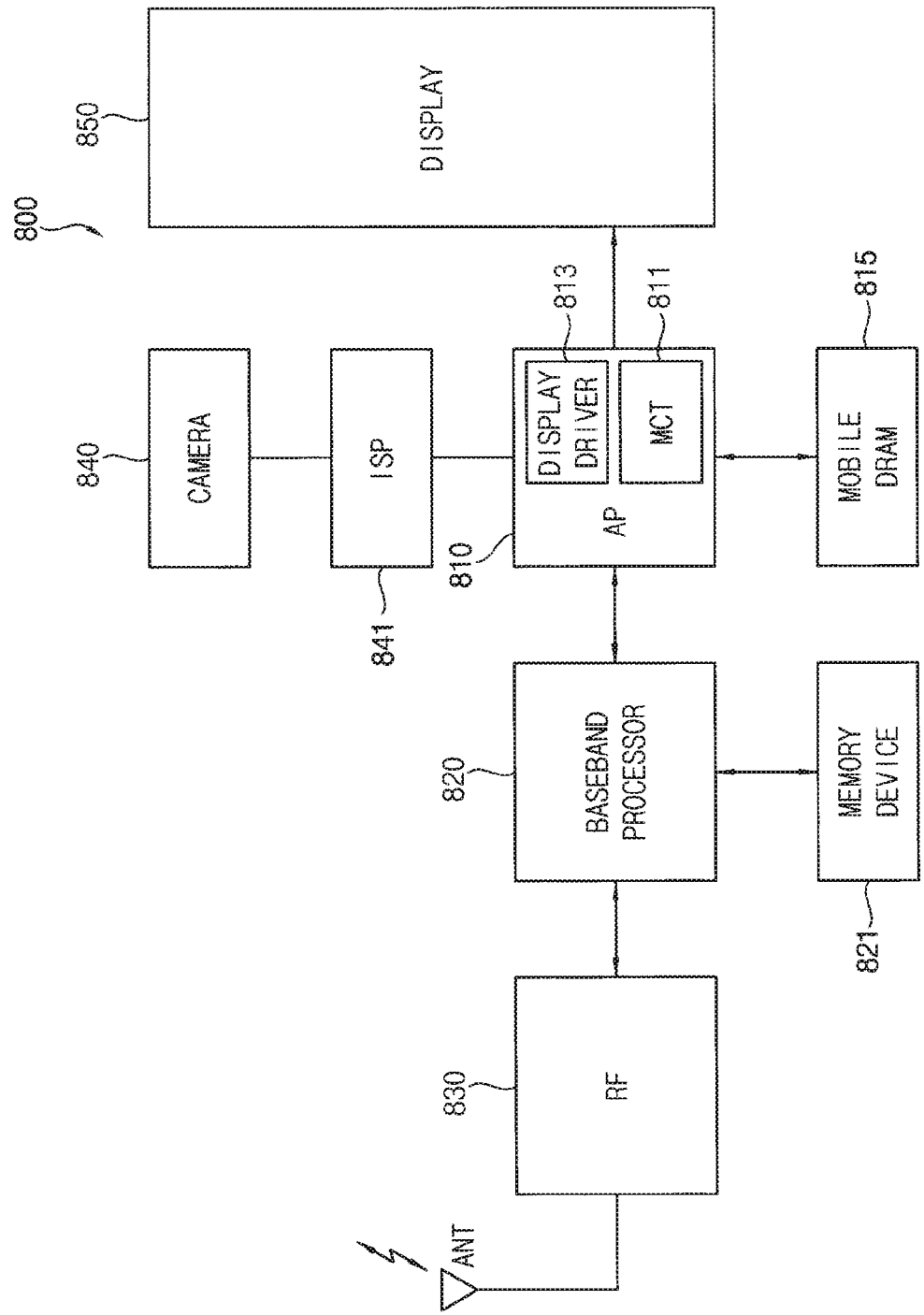
FIG. 19 is a block diagram illustrating a smartphone employing a semiconductor memory device according to an exemplary embodiment of the inventive concept.

FIG. 19 is a block diagram illustrating a smartphone employing a semiconductor memory device according to an exemplary embodiment of the inventive concept.

Referring to FIG. 19, a smartphone 800 may be implemented with a mobile computing device. An application processor (AP), for example, a mobile application processor 810, may control components 815, 820, 841, and 850 of the smartphone 800.

The mobile application processor 810 may use a mobile DRAM 815 as a work memory. A memory device 821 may be used as a work and program memory of a baseband processor 820.

In FIG. 19, the mobile DRAM 815 may be implemented with the semiconductor memory device 200 of FIG. 2. A memory controller (MCT) 811 included in the application processor 810 may control an access to the mobile DRAM 815. A display driver 813 included in the application processor 810 may control a display 850.

The baseband processor 820 may allow data to be exchanged between a wireless transceiver 830 and the application processor 810. Data processed by the baseband processor 820 may be sent to the application processor 810 or may be stored at the memory device 821. The memory device 821 may be implemented with a volatile memory or a nonvolatile memory.

Wireless data received through an antenna ANT may be transmitted to the baseband processor 820 by way of the wireless transceiver 830, and data outputted from the baseband processor 820 may be converted into wireless data by the wireless transceiver 830. The converted wireless data may be outputted through the antenna ANT.

The image signal processor 841 may process a signal from a camera (or an image sensor) 840 and may transfer the processed signal to the application processor 810.

As described above, according to exemplary embodiments of the inventive concept, the semiconductor memory device employs the ECC engine to perform the s-bit ECC encoding on a main data to generate parity bits in response to a first command, perform the t-bit ECC decoding to correct one error bit in response to a second command, and perform the s-bit ECC decoding to correct two error bits.

Therefore, the semiconductor memory device may selectively perform the s-bit ECC decoding, which requires long execution time, on weak pages based on a number of error bits and may enhance performance by reducing overhead of ECC decoding.

Aspects of the inventive concept may be applied to systems using semiconductor memory devices that employ an ECC engine. For example, aspects of the inventive concept may be applied to systems such as a smartphone, a navigation system, a notebook computer, a desktop computer, or a game console that use the semiconductor memory device as a working memory.

While the inventive concept has been particularly shown and described with reference to exemplary embodiments thereof, it will be understood by those of ordinary skill in the art that various changes in form and details may be made thereto without departing from the spirit and scope of the inventive concept as set forth by the following claims.

What is claimed is:

1. A semiconductor memory device comprising:
   a memory cell array including a plurality of bank arrays, each of the plurality of bank arrays including dynamic memory cells;
   an error correction code (ECC) engine;
   an input/output (I/O) gating circuit connected between the ECC engine and the memory cell array; and
   a control logic circuit configured to generate a first control signal to control the I/O gating circuit and a second control signal to control the ECC engine, in response to an access address and a command received from an outside,
   wherein the control logic circuit is configured to control the ECC engine to perform s-bit ECC encoding on a write data to be stored in a first page of at least one bank array selected from the plurality of bank arrays, in response to a first command, and is configured to control the ECC engine to perform t-bit ECC decoding on a first codeword read from the first page, in response to a second command, and
   wherein s is a natural number greater than one and t is a natural number smaller than s.

2. The semiconductor memory device of claim 1, wherein the first command is a write command and the second command is a read command.

3. The semiconductor memory device of claim 1, wherein the first codeword is designated by the access address.

4. The semiconductor memory device of claim 1, wherein the control logic circuit is configured to further control the ECC engine to perform s-bit ECC decoding on a second codeword read from a second page of the memory cell array, in response to a third command.

5. The semiconductor memory device of claim 4, wherein the ECC engine is configured to perform a scrubbing operation to perform the s-bit ECC decoding on the second codeword, to correct at least one error bit in the second codeword and to write back the corrected second codeword in a sub-page of the second page, in response to the third command.

6. The semiconductor memory device of claim 4, wherein the third command is a refresh command.

7. The semiconductor memory device of claim 6, wherein the ECC engine is configured to perform the scrubbing operation M-times while the refresh command is applied N-times, and
   wherein N is a natural number greater than one and M is a natural number smaller than N.

8. The semiconductor memory device of claim 4, wherein the second page or the second codeword is designated by an internal address which is generated inside the semiconductor memory device.

9. The semiconductor memory device of claim 1, further comprising:
   a victim address detector configured to count a number of accesses to a first memory region in the selected at least one bank array to generate at least one victim address designating at least one adjacent memory region adjacent to the first memory region, when the number of the counted accesses reaches a reference value during a reference interval; and
   a weak address table to store the at least one victim address as a weak address.

10. The semiconductor memory device of claim 9, wherein:
   the ECC engine is configured to provide an error generation signal to the control logic circuit when the t-bit ECC decoding detects at least one error bit in the first codeword,
   the control logic circuit is configured to store an address of the first codeword in the weak address table as an error address, and
   when the access address matches one of addresses stored in the weak address table, the control logic circuit is configured to control the ECC engine to perform the s-bit ECC decoding on codewords in a page designated by the access address.

11. The semiconductor memory device of claim 9, wherein:
   the control logic circuit, in response to a third command, is configured to control the ECC engine to perform the s-bit ECC decoding on a second codeword read from a second page in the memory cell array,
   the ECC engine, in response to the third command, is configured to perform a scrubbing operation to perform the s-bit ECC decoding on the second codeword, to correct at least one error bit in the second codeword, and to write back the corrected second codeword in a sub-page of the second page, and
   the ECC engine is configured to generate an error generation signal to the control logic circuit such that an address of the second codeword is to be stored in the weak address table.

12. The semiconductor memory device of claim 1, wherein the ECC engine includes:

an ECC encoder configured to perform the s-bit ECC encoding on a main data to generate parity bits to be stored in the first page; and an ECC decoder to perform one of the s-bit ECC decoding on the first codeword read from the memory cell array and the t-bit ECC decoding on a second codeword read from the memory cell array, in response to an error mode signal.

13. The semiconductor memory device of claim 12, wherein the ECC decoder includes:
a syndrome generation circuit configured to generate a syndrome by using read data including the first codeword or the second codeword;
a coefficient calculator configured to generate coefficients of an error polynomial by using the syndrome;
a roots calculator configured to generate roots of the error polynomial in response to the coefficients;
an error locator configured to generate an error position signal indicating a position of an error bit in the read data based on the syndrome or the roots;
a data corrector configured to correct the at least one error bit in the read data in response to the error position signal to output a corrected main data; and
a selection circuit configured to provide the syndrome to one of the coefficient calculator and the error locator in response to the error mode signal.

14. The semiconductor memory device of claim 12, wherein the selection circuit, in response to the error mode signal, is configured to:
provide the syndrome to the error locator when the ECC decoder performs the t-bit ECC decoding; and
provide the syndrome to the coefficient calculator when the ECC decoder performs the s-bit ECC decoding.

15. The semiconductor memory device of claim 1, comprising:
first group dies including at least one buffer die; and
second group dies including a plurality of memory dies, wherein the plurality of memory dies are stacked on the first group dies and configured to convey data through a plurality of through silicon via (TSV) lines,
wherein at least one of the plurality of memory dies includes the memory cell array and the ECC engine, and the ECC engine generates transmission parity bits using transmission data to be sent to the first group dies, and
wherein the at least one buffer die includes a via ECC engine configured to correct a transmission error using the transmission parity bits when a transmission error is detected from the transmission data received through the plurality of TSV lines.

16. The semiconductor memory device of claim 15, wherein the semiconductor memory device is a high-bandwidth memory (HBM).

17. The semiconductor memory device of claim 15, wherein the ECC engine is configured to correct error output from the plurality of memory dies before the transmission data is sent to the at least one buffer die.

18. A memory system comprising:
at least one semiconductor memory device; and
a memory controller configured to control the at least one semiconductor memory device, wherein the at least one semiconductor memory device includes:
a memory cell array including a plurality of dynamic memory cells;
an error correction code (ECC) engine;
an input/output (I/O) gating circuit connected between the ECC engine and the memory cell array; and
a control logic circuit configured to control the I/O gating circuit and the ECC engine, in response to an access address and a command received from the memory controller,
wherein the control logic circuit is configured to control the ECC engine to perform s-bit ECC encoding on a write data to be stored in a first page of at least one bank array selected from the memory cell array, in response to a first command from the memory controller, and is configured to control the ECC engine to perform t-bit ECC decoding on a first codeword read from the first page, in response to a second command from the memory controller, and
wherein s is a natural number greater than one and t is a natural number smaller than s.

19. The memory system of claim 18, wherein:
the first command is a write command and the second command is a read command,
the control logic circuit is configured to further control the ECC engine to perform s-bit ECC decoding on a second codeword read from a second page of the memory cell array, in response to a third command from the memory controller, and
the third command is a refresh command.

20. A method of operating a semiconductor memory device including a memory cell array that includes a plurality of dynamic memory cells, the method comprising:
performing s-bit ECC encoding on a main data to be stored in a first page in the memory cell array to store a first codeword in the first page, in response to an access address and a first command received from an outside;
performing t-bit ECC decoding on the first codeword read from the first page in response to a second command received from the outside;
performing s-bit ECC decoding on a second codeword read from a second page of the memory cell array, in response to a third command received from the outside; and
writing back the second codeword corrected by the s-bit ECC decoding, in a sub-page of the second page,
wherein s is a natural number greater than one and t is a natural number smaller than s.

* * * * *